United States Patent [19]
Kadakia

[11] Patent Number: 4,888,498
[45] Date of Patent: Dec. 19, 1989

[54] INTEGRATED-CIRCUIT POWER-UP PULSE GENERATOR CIRCUIT

[75] Inventor: Shailesh R. Kadakia, Stafford, Tex.

[73] Assignee: Texas Instruments Incorporated, Dallas, Tex.

[21] Appl. No.: 172,532

[22] Filed: Mar. 24, 1988

[51] Int. Cl.[4] .................... G11C 11/00; H03K 3/01
[52] U.S. Cl. .................... 307/296.4; 307/296.5; 307/272.3; 307/592; 307/597; 307/605; 307/296.6
[58] Field of Search ............... 307/246, 360, 592, 594, 307/596, 597, 603, 605, 296.4, 296.5, 272.3, 296 R, 297

[56] References Cited

U.S. PATENT DOCUMENTS

| | | | |
|---|---|---|---|
| 4,367,422 | 1/1983 | Leslie | 307/597 |
| 4,477,736 | 10/1984 | Orishi | 307/297 |
| 4,591,745 | 5/1986 | Shen | 307/594 |
| 4,656,369 | 4/1987 | Lou | 307/297 |
| 4,670,668 | 6/1987 | Liu | 307/296 R |
| 4,675,557 | 6/1987 | Huntington | 307/297 X |
| 4,692,689 | 9/1987 | Takemae | 307/297 X |
| 4,717,848 | 1/1988 | Ouyang et al. | 307/594 |

Primary Examiner—Stanley D. Miller
Assistant Examiner—Huy K. Mai
Attorney, Agent, or Firm—Theodore D. Lindgren

[57] ABSTRACT

A circuit for providing a "power-up" signal pulse in response to energization of an integrated circuit logic array by a power supply. The circuit is comprised of a pulse-generating circuit and of an optional pulse-delay means. The pulse-generating circuit means detects the presence or absence of change in energization voltage potential and, in response to energization, develops an output pulse using ratioed complementary-metal-oxide-semiconductor (CMOS) logic to detect energization status during the ramp increase of the supply voltage. A feedback circuit is used to detect completion of the ramp increase and to deactivate the circuit to minimize power required for steady-state operation. The optional pulse-delay means is illustrated as narrow-width, long-channel CMOS inverters with optional capacitor loading.

9 Claims, 2 Drawing Sheets

INTEGRATED-CIRCUIT POWER-UP PULSE GENERATOR CIRCUIT

BACKGROUND OF THE INVENTION

This invention relates to a circuit for creating a pulse output signal each time that an erasable-programmable-array-logic (EPAL) integrated circuit is energized by a source of power and for delaying transmission of that presetting pulse to individual logic elements of that inegrated circuit.

Control logic circuits that use some form of storage element, such as a register or a set-reset flip-flop, generally need an initialization signal pulse. The initialization or "power-up" signal pulse is necessary to force the output of each such storage element to a predetermined condition, either a "1" or a "0", immediately or shortly after the logic circuit power is switched ON from the OFF state. Forcing the storage elements to a predetermined condition tends to prevent unpredictable and unwanted operations that sometimes occur during or shortly after the time interval required for the voltage at the power supply input terminal to rise to a steady-state value of voltage. Such unpredictable operations include spurious write cycles in an electrically-programmable-read-only-memory (EPROM) cell and include illegal states of a finite-state machine implemented by a set of EPAL logic arrays.

An example of a prior-art circuit for creating a "power up" pulse signal is illustrated in U.S. Pat. No. 4,716,322, issued to Sebastiano D'Arrigo, Giuliano Imondi and Sossio Vergara, and assigned to Texas Instruments Incorporated. The circuit described in that patent requires a clock input, a separate reference voltage input, and two resistors formed on an integrated-circuit substrate. A circuit that eliminates the need for a clock input, a separate reference voltage input, and resistor fabrication is desirable.

SUMMARY OF THE INVENTION

The circuit of this invention provides a "power-up" signal pulse in response to energization of an integrated circuit by a power supply. The circuit does not require a clock input, a separate reference voltage input, nor does it require fabrication of resistors on an integrated-circuit substrate.

The circuit described and claimed herein is comprised in part of a pulse-generating means that detects the presence or absence of change in energization status of the power supply and, in response to each energization, develops a pulse output. Ratioed complementary-metal-oxide-semiconductor (CMOS) logic is used to detect the status of voltage at the power input terminal as the voltage at that terminal increases from reference voltage to the voltage of the power supply. A unique feedback configuration detects the time at which the voltage at the input terminal reaches a steady state value and, at that time, deactivates the "power-up" circuit to minimize the power requirement during non-power-switching operation of the logic circuit to which it is connected.

The circuit is also comprised of an optional pulse delay means that may in turn be comprised of narrow-width, long-channel CMOS inverters with interleaved capacitor leads. The delayed pulse output of the "power-up" circuit may also be applied to latches and registers or other subcircuits of the logic circuit undergoing initial energization by the power supply.

BRIEF DESCRIPTION OF THE DRAWINGS

The novel features of this invention are set forth in the appended claims. The invention, its features, and its advantages are described below in conjunction with the following drawings:

DESCRIPTION OF THE PREFERRED EMBODIMENTS

Figure 1:
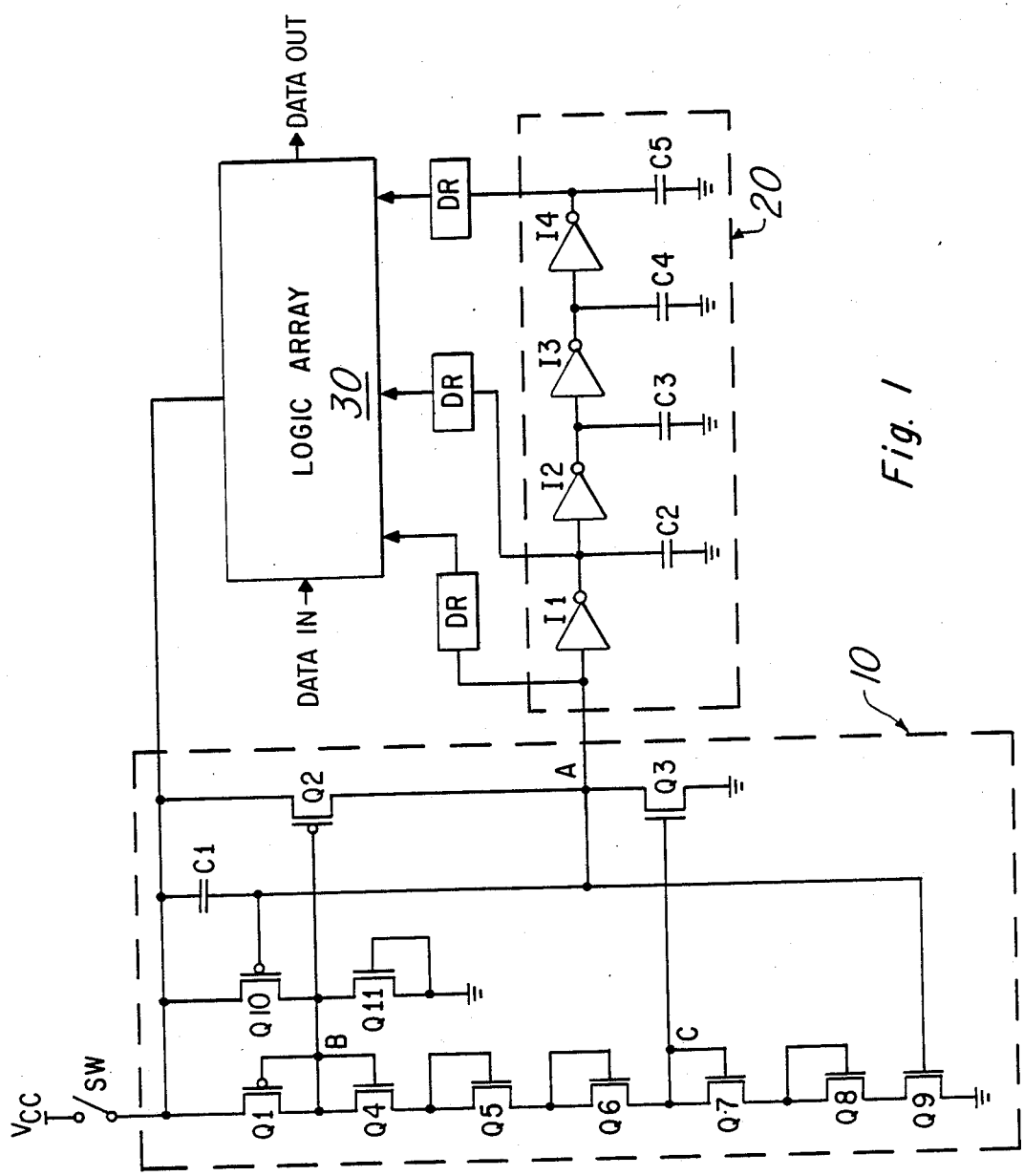
FIG. 1 is a circuit diagram in partial block form illustrating an embodiment of the "power-up" circuit of this invention.

Referring to FIG. 1, voltage source Vcc is connected by means of a mechanical or electronic switch SW to an input node IN of an integrated circuit that includes a "power-up" circuit comprised of a pulse-generating circuit means 10 and of optional delay circuit means 20 and includes a logic array 30. The output of pulse-generating circuit means 10 is at node A. Pulse-generating means 10 is comprised in part of P-channel, metal-oxide semiconductor (P-MOS) transistor Q1 with source-drain path connected between input node IN and node B, which is connected to the upper terminal of diode stack Q4–Q8. The gate of diode-configured, stack-charging transistor Q1 is connected to node B. N-channel, metal-oxide-semiconductor (N-MOS) transistors Q4, Q5, Q6, Q7 and Q8 comprise diode stack Q4–Q8. The source-drain paths of N-MOS transistors Q4–Q8 are connected in series between node B and a source-drain terminal of current-control transistor Q9. The other source-drain terminal of transistor Q9 is connected to ground or other source of reference potential. The gate of current-control transistor Q9 is connected to the node A output of pulse-generating circuit 10.

Referring again to FIG. 1, the diode configuration of each device Q4–Q8 is accomplished by connecting the gate terminal to the drain terminal. Each device is forward-biased if the drain terminal is at a higher voltage potential than the voltage potential at the source terminal.

P-MOS first pulse-control transistor Q2 of FIG. 1 has source-drain terminals connected between terminal IN and output terminal A of pulse-generating means 10. The gate of first pulse-control transistor Q2 is connected to upper terminal B of diode stack Q4–Q8. N-MOS second pulse-control transistor Q3 has source-drain terminals connected between output terminal A of pulse-generating means 10 and ground or reference voltage. The gate of second pulse-control transistor Q3 is connected to tap C of diode stack Q4–Q8, illustrated at the common source-drain connection of diodes Q6 and Q7.

P-MOS biasing transistor Q10 of FIG. 1 has source-drain path connected between terminal IN and upper terminal B of diode stack Q4–Q8 and has its gate terminal connected to output node A of pulse-generating means 10. Optional N-MOS float-prevention transistor Q11 has source-drain path connected between upper diode stack terminal B and ground or reference potential and has its gate terminal connected to ground or reference potential.

Pulse-control capacitor C1 of FIG. 1 is connected between terminal IN and output node A of pulse-generating means 10.

During operation of pulse-generating means 10 of FIG. 1 P-MOS diode Q1 charges the N-MOS diode stack formed by devices Q4–Q8 through N-MOS device Q9 as the voltage input terminal IN ramps up after being connected to supply voltage Vcc. The P-MOS and N-MOS devices Q2 and Q3 of circuit means 10 are driven by the voltage at the two nodes B and C tapped from diode stack Q4–Q8. After connection to supply voltage Vcc, the voltage at terminal IN will undergo a ramped increase from ground or reference voltage to the steady-state terminal voltage output of source Vcc. The ramp increase results from the inherent resistance, capacitance and inductance present in the source Vcc and all of the circuit elements connected to source Vcc. During the initial ramp increase in voltage at terminal IN, N-MOS device Q9 is maintained in a conductive state and P-MOS device Q10 is maintained in a nonconductive state, both states resulting from the relatively constant value of voltage across capacitor C1 supplied at node A to the gates of devices Q9 and Q10. The relatively constant value of voltage across capacitor C1 is initially a very low value. The gate terminal of device Q2 is maintained one threshold voltage Vt below supply voltage Vcc as long as the N-MOS device Q3 remains in a nonconducting state. Thus the P-MOS device Q2 is operated at near cut-off or near nonconduction, allowing node A to follow the ramp increase in voltage at node IN. At the time that the ramp increase in voltage at node IN reaches a sufficiently high value, the voltage at the node C tap of diode stack Q4–Q8 will be above the threshhold voltage of N-MOS device Q3. This will cause Q3 to become conductive since the drive on the gate terminal of Q2 is much weaker than that of Q3, the gate terminal of which is illustrated in FIG. 1 as tied to the third tap of diode stack Q4–Q8 from the ground end. As discussed below, another tap may be selected for the purpose of determining the terminal IN threshhold voltage at which the trailing edge of the power-up pulse commences. As Q3 becomes increasingly conductive, it overpowers Q2. At that time, the voltage at node A will decrease to ground or reference potential. The rate of discharge is a function of the value of capacitor C1 and the conductivity of device Q3, which is in turn a function of the ratio of the width to the length of the channel of N-MOS device Q3. When node A reaches ground potential, device Q9 becomes nonconductive and device Q10 conducts heavily. That causes the voltage at node B to increase to the level of voltage supply Vcc. The P-MOS device Q2 then becomes nonconductive and, therefore, pulse-generating circuit means 10 consumes no power during steady-state operation.

The voltage waveform on node A exhibits a pulse having a risetime characteristic similar to the ramp increase in voltage at terminal IN and exhibits a rapid and fixed rate of fall. The terminal IN voltage level at which the trailing edge of the power-up clear pulse will occur can be set by selecting the node C tap connection of gate terminal of Q3 to the desired number of diode voltage drops in N-MOS diode chain Q4–Q8. The presence of device Q10 ensures that the P-MOS device Q2 is completely nonconductive when the voltage at terminal IN has reached its final value. The optional N-MOS device Q11 provides a current path for the subthreshhold currents of devices Q1 and Q10, thereby preventing the voltage at node B from floating during the initial stages of power-up.

As is well-known in the art, P-MOS transistors of a first conductivity type may be replaced by N-MOS transistors of a second conductivity type and the N-MOS transistors may be replaced by P-MOS transistors without generally adversely affecting circuit performance.

Referring again to FIG. 1, optional delay circuit means 20 is illustrated a series chain of inverters I1-I4, which are constructed using narrow-width, long-channel P-MOS and N-MOS devices. To increase further the delay time associated with each inverter stage, the chain may be loaded with capacitors C2-C5 connected between the output of each of inverters I1-I4 and ground or reference potential.

The delayed output of circuit 20 and other outputs and inverted outputs may be used to drive driver circuits DR having capacities suitable for the load sizes of logic array 30.

Figure 2:
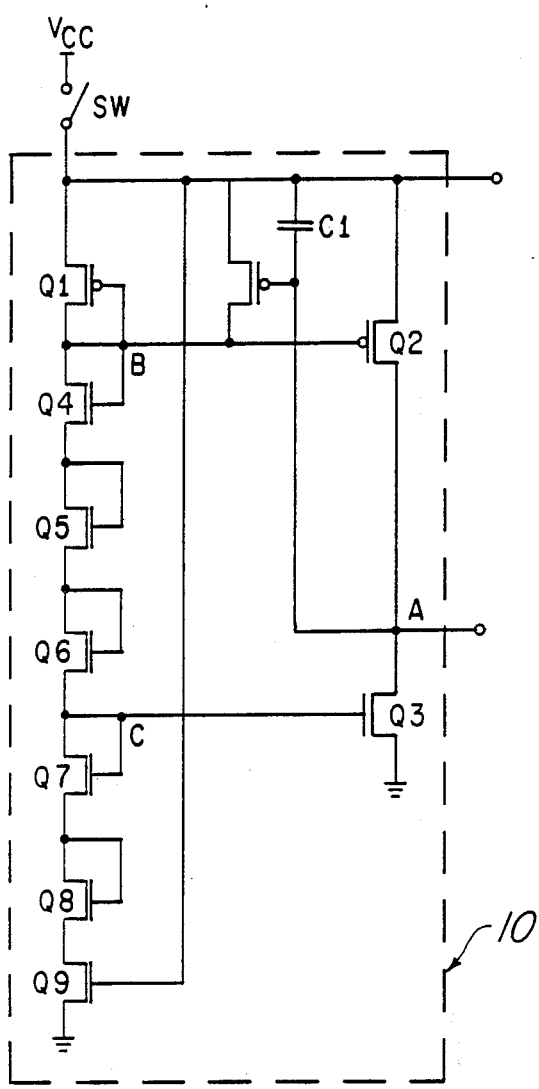
FIG. 2 is an alternative embodiment of the pulse-generating means of the circuit of this invention.
Figure 3:
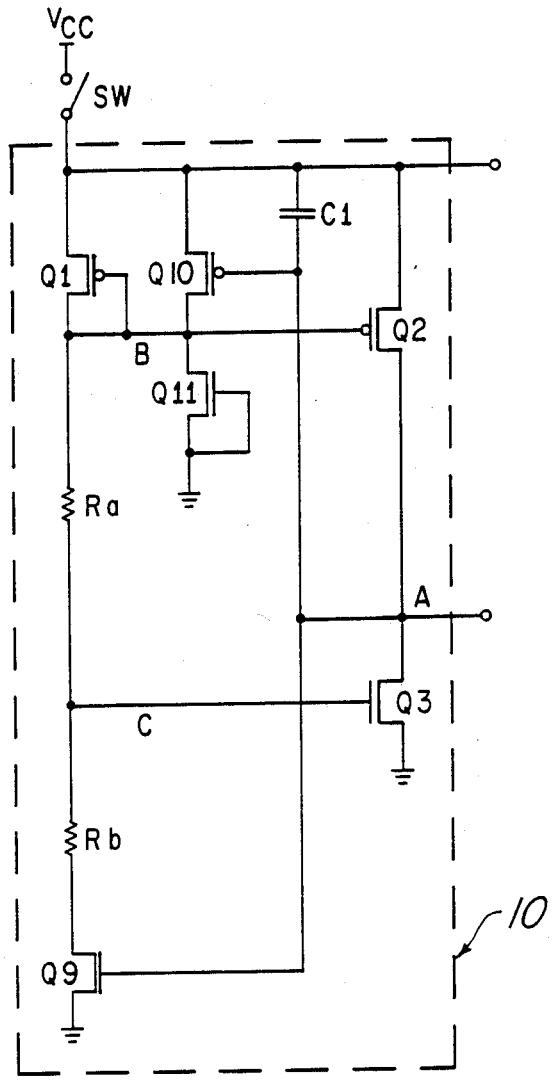
FIG. 3 is an alternative embodiment of the pulse-generating means of the circuit of this invention, illustrating use of a resistor chain rather than a diode chain to determine pulse shape.

Two possible variations of the pulse-generating circuit means 10 of FIG. 1 are illustrated in FIGS. 2 and 3. In FIG. 2 the gate terminal of device Q9 is returned to input terminal IN instead of using the feedback connection scheme of FIG. 1. With the return connection, Q9 stays conductive at all times during steady-state condition of voltage at terminal IN and, therefore, current-control transistor Q9 is optional. This will ensure that all internal nodes of the diode strings are hard driven. The circuit has the advantage of very high immunity to power supply variations and to noise coupled to the nodes through any parasitic conducting paths.

Referring to FIG. 3, the diode divider chain Q4–Q8 of FIG. 1 is replaced by a resistance divider Ra and Rb. The low resistivity of silicided moat and polysilicon layered process makes it impracticable to build high-value resistance in a small die space. On the other hand, a low-value resistor chain could draw higher power and the circuit will be more sensitive to temperature and process variations.

While this invention has been described with reference to an illustrative embodiment, this description is not intended to be construed in a limiting sense. Various modifications of the illustrative embodiments, as well as other embodiments of the invention, will, upon reference to this description, be apparent to persons skilled in the art. It is contemplated that the appended claims will cover any such modifications or embodiments that fall within the true scope of the invention.

I claim:

1. A pulse-generating circuit comprising:
   a diode-stack-charging transistor of a first conductivity type having source-drain path connected between a power input terminal and the upper terminal of a diode stack and having gate terminal connected to said upper terminal of said diode stack;
   a diode stack comprising a plurality of transistors of a second conductivity type with source-drain paths connected in series between said upper terminal of said diode stack and a source of reference potential, with gate terminal connected to the drain terminal of each of said plurality of transistors, and with a diode-stack tap terminal at a common source-drain terminal of said plurality of transistors;
   a first pulse-control transistor of first conductivity type with source-drain path connected between said power input terminal and said output terminal of said pulse-generating circuit and with gate terminal connected to said upper terminal of said diode stack;

a second pulse-control transistor of second conductivity type with source-drain path connected between said output terminal of said pulse-generating circuit and said source of reference potential and with gate terminal connected to said diode-stack tap terminal;

a bias transistor of first conductivity type with source-drain path connected between said power input terminal and said upper terminal of said diode stack and with gate terminal connected to said output terminal of said pulse-generating circuit; and a pulse-control capacitor connected between said power input terminal and said output terminal of said pulse-generating circuit.

2. The pulse-generating circuit of claim 1 also comprising a float-prevention transistor of second conductivity type with source drain path connected between said upper terminal of said diode stack and said source of reference potential and with gate terminal connected to said source of reference potential.

3. The pulse-generating circuit of claim 1 in which a current-control transistor of second conductivity type is connected with source-drain path between said source-drain paths of said diode stack and said source of reference potential and with gate terminal of said current-control transistor connected to said power input terminal.

4. The pulse-generating circuit of claim 1 in which said diode stack is replaced by a plurality of series-connected resistors having said tap terminal connected to a common terminal of two of said series-connected resistors.

5. The pulse-generating circuit of claim 1 in which at least one of said first and second pulse-control transistors have channel width and length chosen to control pulse shape.

6. The pulse-generating circuit of claim 1 in which said diode stack tap is chosen to control pulse height.

7. The pulse-generating circuit of claim 1 in which transistors of said first conductivity type are P-MOS transistors and in which transistors of said second conductivity type are N-MOS transistors.

8. The pulse-generating circuit of claim 1 in which transistors of said first conductivity type are N-MOS transistors and in which transistors of said second conductivity type are P-MOS transistors.

9. The pulse-generating circuit of claim 1 in which a current-control transistor of second conductivity type is connected with source-drain path between said source-drain paths of said diode stack and said source of reference potential and with gate terminal connected to the output terminal of said pulse-generating circuit.

* * * * *